US006867124B1

(12) United States Patent
Clemons et al.

(10) Patent No.: US 6,867,124 B1
(45) Date of Patent: Mar. 15, 2005

(54) INTEGRATED CIRCUIT PACKAGING DESIGN AND METHOD

(75) Inventors: Gregory S. Clemons, Chandler, AZ (US); Christopher L. Rumer, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/728,290

(22) Filed: Dec. 4, 2003

(51) Int. Cl.[7] .............................................. H01L 21/44
(52) U.S. Cl. ...................... 438/616; 438/108; 438/109; 438/612; 438/613; 438/106
(58) Field of Search .................................. 438/616, 108, 438/109, 612, 613, 106; 257/686, 723, 778, 683, 779, 777; 361/760, 735, 743, 729

(56) References Cited

U.S. PATENT DOCUMENTS

| | | | | |
|---|---|---|---|---|
| 5,154,341 A | * | 10/1992 | Melton et al. | 228/180.22 |
| 5,729,440 A | * | 3/1998 | Jimarez et al. | 361/779 |
| 5,829,125 A | * | 11/1998 | Fujimoto et al. | 29/840 |
| 6,133,626 A | * | 10/2000 | Hawke et al. | 257/686 |
| 6,140,707 A | * | 10/2000 | Plepys et al. | 257/778 |
| 6,414,849 B1 | * | 7/2002 | Chiu | 361/760 |
| 6,433,425 B1 | * | 8/2002 | Sarkhel | 257/737 |
| 6,451,626 B1 | * | 9/2002 | Lin | 438/108 |
| 6,662,442 B1 | * | 12/2003 | Matsui et al. | 29/852 |
| 2004/0012934 A1 | * | 1/2004 | Jafari et al. | 361/760 |
| 2004/0012938 A1 | * | 1/2004 | Sylvester et al. | 361/794 |

FOREIGN PATENT DOCUMENTS

JP 2002016214 A * 1/2002 ......... H01L/25/065

OTHER PUBLICATIONS

"Products: Spark 100", BeamWorks Automated Selective Assembly, download from http://www.beamworks.com/spark100.html on Jul. 24, 2003. 2pgs.
"Products: Spark 400", BeamWorks Automated Selective Assembly, download from http://www.beamworks.com/spark400.html on Jul. 24, 2003. 3pgs.
Prasad, Ray: "Selective Automated Laser Assembly", SMT Magazine, Jan. 2001, download from http://www.rayprasad.com/columns/laser.html on Jul. 24, 2003. 3pgs.
"SPARK 400 Automated Selective Assembly System", BeamWorks Automated Selective Assembly. 4pgs.
"Technology", BeamWorks Automated Selective Assembly, download from http://www.beamworks.com/technology.html on Jul. 24, 2003. 2pgs.

* cited by examiner

*Primary Examiner*—Matthew Smith
*Assistant Examiner*—Igwe U. Anya
(74) *Attorney, Agent, or Firm*—Buckley, Maschoff & Talwalkar LLC

(57) ABSTRACT

A system may direct first energy to only a first interconnect element, the first interconnect element contacting a first conductive contact of a first device and a second conductive contact of a second device. A first electrical connection may be formed between the first conductive contact and the second conductive contact based at least in part on the first energy. Further, second energy may be directed to only a second interconnect element, the second interconnect element contacting a third conductive contact of the first device and a fourth conductive contact of the second device. A second electrical connection may be formed between the third conductive contact and the fourth conductive contact based at least in part on the second energy.

14 Claims, 10 Drawing Sheets

INTEGRATED CIRCUIT PACKAGING DESIGN AND METHOD

BACKGROUND

Electronic devices are often subjected to extreme conditions during their manufacture and/or during the manufacture of systems that include the electronic devices. For example, integrated circuits, capacitors and resistors may be heated to extremely high temperatures within a reflow oven in order to solder the devices to a circuit board of an electronic device. As electronic device geometries and tolerances decrease, the susceptibility of devices to heat and other environmental conditions generally increases. Current manufacturing techniques utilize gold stud bump bonding and/or anisotropic conductive film in an attempt to subject electrical devices to more moderate manufacturing conditions.

DETAILED DESCRIPTION

Figure 1:
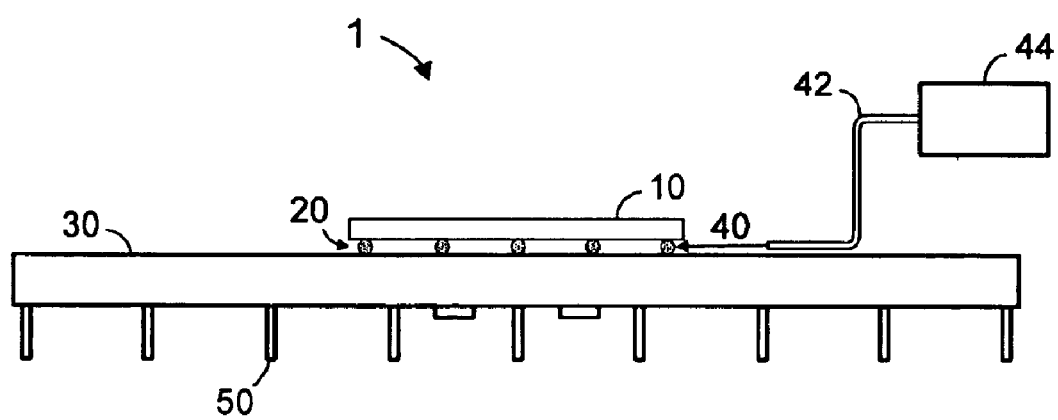
FIG. 1 is a side elevation of an apparatus according to some embodiments.

FIG. 1 is a side elevation of apparatus 1 according to some embodiments. Apparatus 1 includes integrated circuit (IC) die 10, interconnect elements 20, and IC package 30. FIG. 1 also illustrates beam 40, optic fiber 42, and laser 44 that may be used to electrically couple IC die 10 to IC package 30 according to some embodiments.

IC die 10 includes integrated active and/or passive electrical devices and may be fabricated using any suitable substrate material and fabrication techniques. IC die 10 may embody a "flip-chip" arrangement and may provide one or more functions. In some embodiments, IC die 10 comprises a microprocessor chip having a silicon substrate. IC die 10 may also or alternatively comprise an element of a polymer memory or a liquid crystal display. IC die 10 includes conductive contacts (not shown) that may be electrically coupled to the devices that are integrated into IC die 10.

Interconnect elements 20 may comprise Controlled Collapse Chip Connect (C4) solder bumps according to some embodiments. Interconnect elements 20 according to some embodiments may include one or more of stud-bumped interconnects, diffusion-bonded interconnects, and other types of interconnects. Interconnect elements 20 are in contact with respective ones of the conductive contacts of IC die 10, and are also in contact with respective ones of the conductive contacts (not shown) of IC package 30. One or more of the aforementioned conductive contacts may be coated with a conductive material such as solder paste and/or conductive epoxy prior to receiving a respective one of interconnect elements 20. The conductive material itself may be considered a conductive contact with which the interconnect element 20 is in contact.

IC package 30 may comprise any ceramic, organic, and/or other suitable material. Conductive contacts of IC package 30 may be electrically coupled to vias within IC package 30 that are in turn coupled to external I/O interfaces of IC package 30. In particular, through-hole pins 50 may be electrically coupled to the conductive contacts of IC package 30 so as to transmit power and I/O signals between IC die 10 and external devices. For example, pins 50 may be used to mount package 30 to a socket on a motherboard or directly to a motherboard.

Beam 40 may be directed to one of interconnect elements 20 after placement of IC die 10 on IC package 30. Beam 40 is emitted from optic fiber 42, which in turn receives beam 40 from laser 44. Laser 44 may comprise a soft beam laser and/or any other type of laser. According to some embodiments, beam 40 directs energy to one of interconnect elements 20 in order to reflow the interconnect element 20 without exposing IC die 10 to potentially damaging temperatures.

Figure 2:
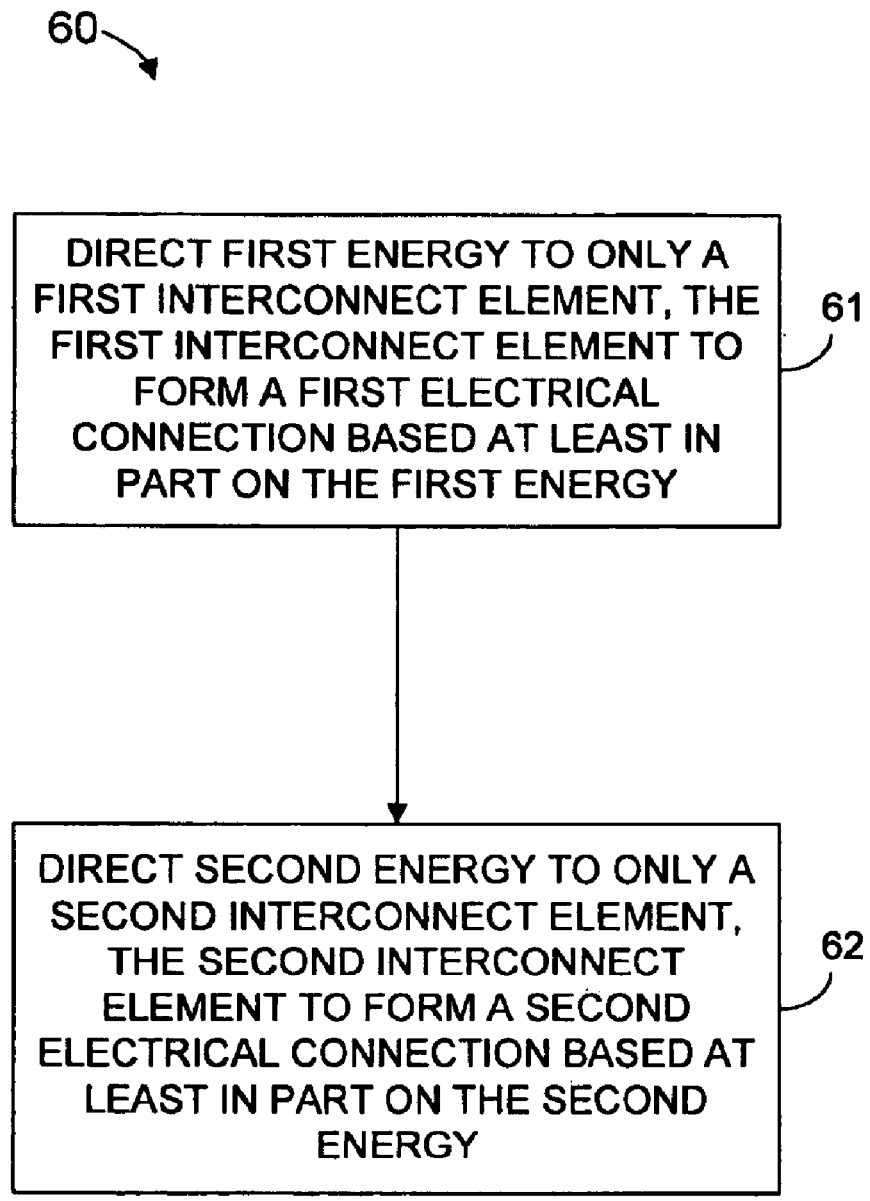
FIG. 2 is a diagram of a process according to some embodiments.

FIG. 2 is a diagram of process 60 according to some embodiments. Process 60 may be executed by one or more devices, and all or a part of process 60 may be executed manually. Process 60 may be executed by an entity different from an entity that manufactures IC die 10 and/or IC package 30.

Initially, at 61, first energy is directed to a first interconnect element. The first interconnect element forms a first electrical connection based at least on the first energy. In some embodiments of 61, optic fiber 42 is positioned to direct beam 40 to only one interconnect element 20. Optic fiber 42 and laser 44 may be mounted in fixed positions on a device that moves both elements to place optic fiber 42 in the proper position. In some embodiments, optic fiber 42 may be moved independently of laser 44 due to its flexibility.

Figure 3:
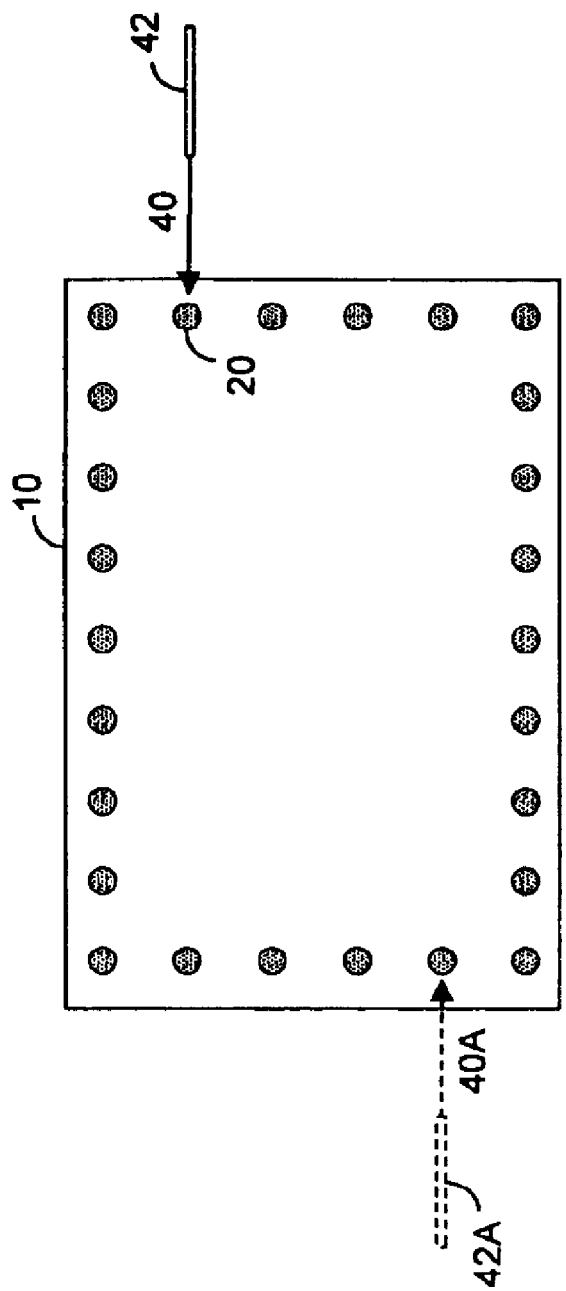
FIG. 3 is a bottom view of an integrated circuit die according to some embodiments.

FIG. 1 illustrates some embodiments in which beam 40 is used to direct energy to one of interconnect elements 20 at 61. FIG. 3 is a view of IC die 10, beam 40 and a portion of optic fiber 42 from a different perspective. As shown, beam 40 is controlled to direct energy to only one of interconnect elements 20.

Next, at 62, second energy is directed to a second interconnect element. The second interconnect element forms a second electrical connection based at least on the second energy. The second electrical connection may electrically couple a conductive contact of IC die 10 to a conductive contact of IC package 30. The dashed outlines of beam 40A and optic fiber 42A illustrate directing second energy to a second interconnect element according to some embodiments. In this regard, the second energy may be directed in a manner similar to that described above with respect to the first energy.

The application of energy to an interconnect element 20 may form an electrical connection between a conductive contact of IC die 10 that contacts the interconnect element 20 and a conductive contact of IC package 30 that also contacts the interconnect element 20. Although the energy is described herein as "forming" an electrical connection, in some embodiments an electrical connection exists between the conductive contacts via interconnect element 20 prior to application of the energy thereto. In some embodiments of process 60, the first energy and/or the second energy may be provided by any other suitable currently- or hereafter-known laser-based or non-laser-based system.

Figure 4:
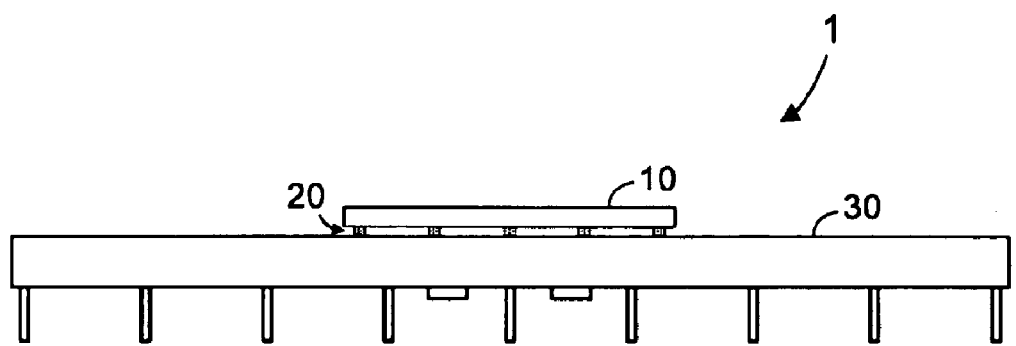
FIG. 4 is a side elevation of an apparatus according to some embodiments.

The energy applied during process 60 assists in causing interconnect element 20 to reflow according to some embodiments. A new electrical connection is therefore formed between the conductive contacts that are in contact with interconnect element 20 after interconnect element 20 has cooled. FIG. 4 shows a side elevation of system 1 after the energy of beam 40 has been directed to each illustrated interconnect element 20. Interconnect elements 20 have reflowed based at least on the energy and, according to the illustrated embodiment, a shape of interconnect elements 20 has changed. Reflowed interconnect elements 20 may provide a suitable electrical and physical connection between IC die 10 and package 30. Elements of IC die 10 and IC package 30 according to some embodiments will be now described in more detail.

Figure 5:
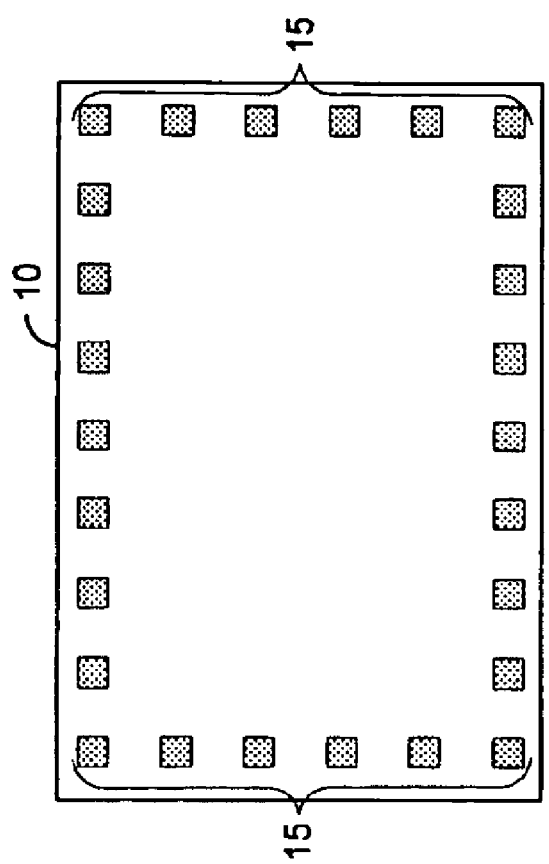
FIG. 5 is a bottom view of an integrated circuit die according to some embodiments.

FIG. 5 is a bottom view of IC die 10 showing conductive contacts 15. Conductive contacts 15 may comprise gold and/or nickel-plated copper contacts fabricated upon IC die 10. In this regard, conductive contacts 15 may be recessed under, flush with, or extending above the illustrated surface of IC die 10. Conductive contacts 15 may be electrically coupled to the active and/or passive devices that are integrated into IC die 10.

Figure 6:
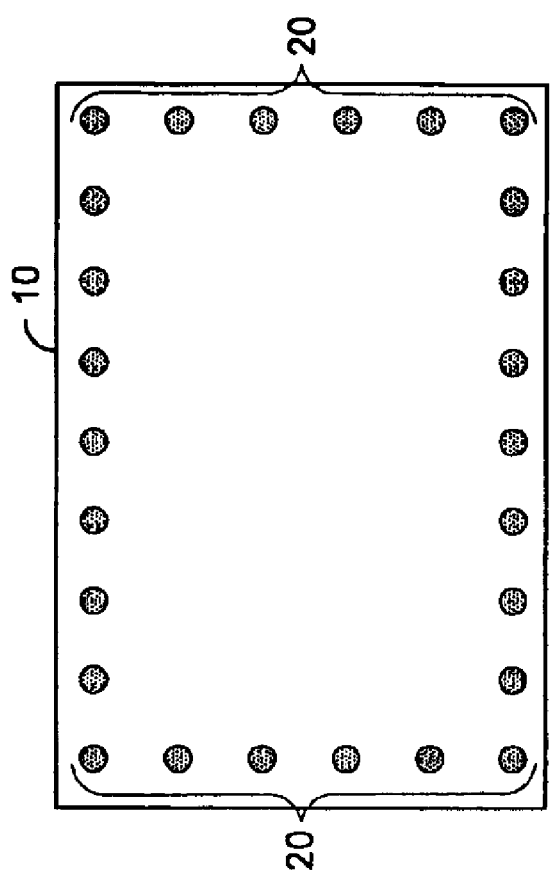
FIG. 6 is a bottom view of an integrated circuit die according to some embodiments.

FIG. 6 illustrates interconnect elements 20 disposed on die 10 according to some embodiments. Interconnect elements 20 may comprise C4 solder bumps fabricated onto conductive contacts 15 of IC die 10 as illustrated in FIG. 5. One or more of interconnect elements 20 may therefore be electrically coupled to the active and/or passive devices of IC die 10 through one or more conductive contacts 15. An IC die according to some embodiments might not comprise interconnect elements 20 of FIG. 6. Rather, in some embodiments, conductive contacts 15 of IC die 10 are coupled to interconnect elements located on IC package 30 when IC die 10 is mounted on IC package 30.

As mentioned above, overheating of sensitive areas of IC die 10 may be avoided in some embodiments by directing energy to individual ones of interconnect elements 20. Conductive contacts 15 of die 10 (and any interconnect elements 20 coupled thereto) may therefore be disposed so as to avoid undesirable heat transfer to areas of IC die 10. For example, conductive contacts 15 may be disposed proximate to a perimeter of IC die 10 under an assumption that most sensitive devices are located at interior locations of IC die 10.

Conductive die contacts 15 may also be disposed so as to facilitate the individual delivery of energy to associated interconnect elements 20. For example, conductive die contacts 15 (and interconnect elements 20) may be disposed only around a perimeter of die 10. Accordingly, optic fiber 42 may be moved relatively around the perimeter of IC die 10 to direct energy to each of interconnect elements 20 in turn.

Figure 7:
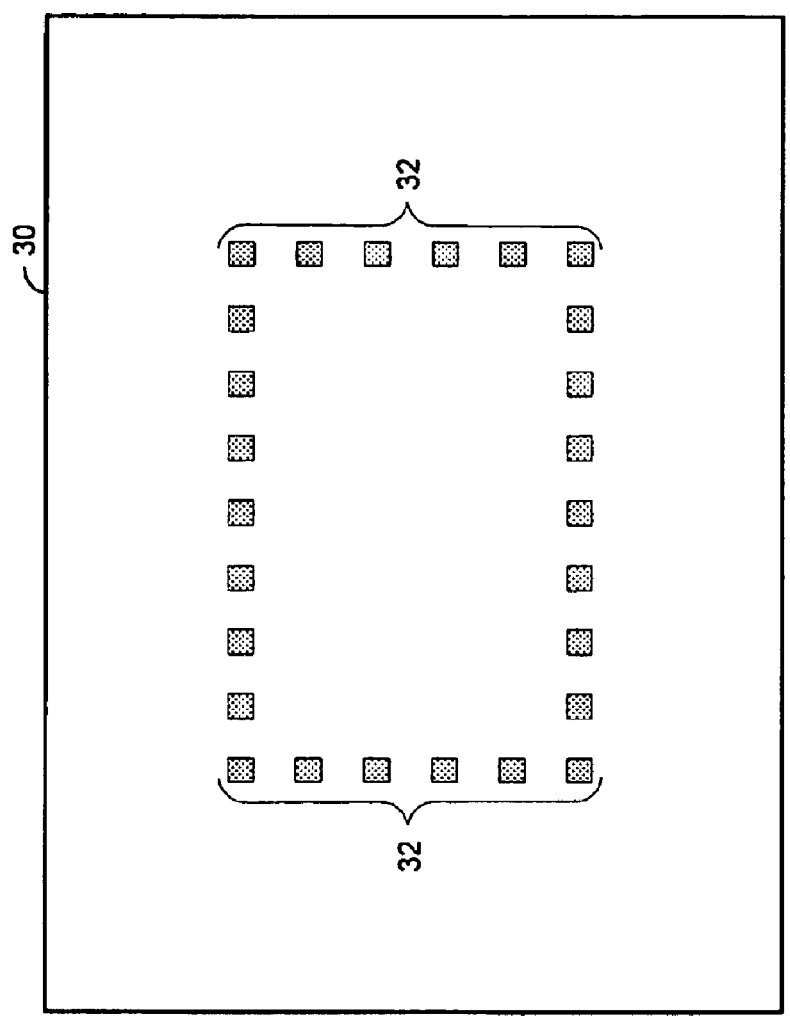
FIG. 7 is a top view of an integrated circuit package according to some embodiments.

FIG. 7 is a top view of IC package 30 according to some embodiments. IC package 30 comprises conductive contacts 32 for interfacing with interconnect elements 20 of IC die 10. Conductive contacts 32 may comprise any combination of conductive material, including gold and/or nickel-plated copper contacts. Conductive contacts 32 may therefore be electrically coupled to the devices integrated in IC die 10 through interconnect elements 20 and through conductive contacts 15 of IC die 10.

Figure 8:
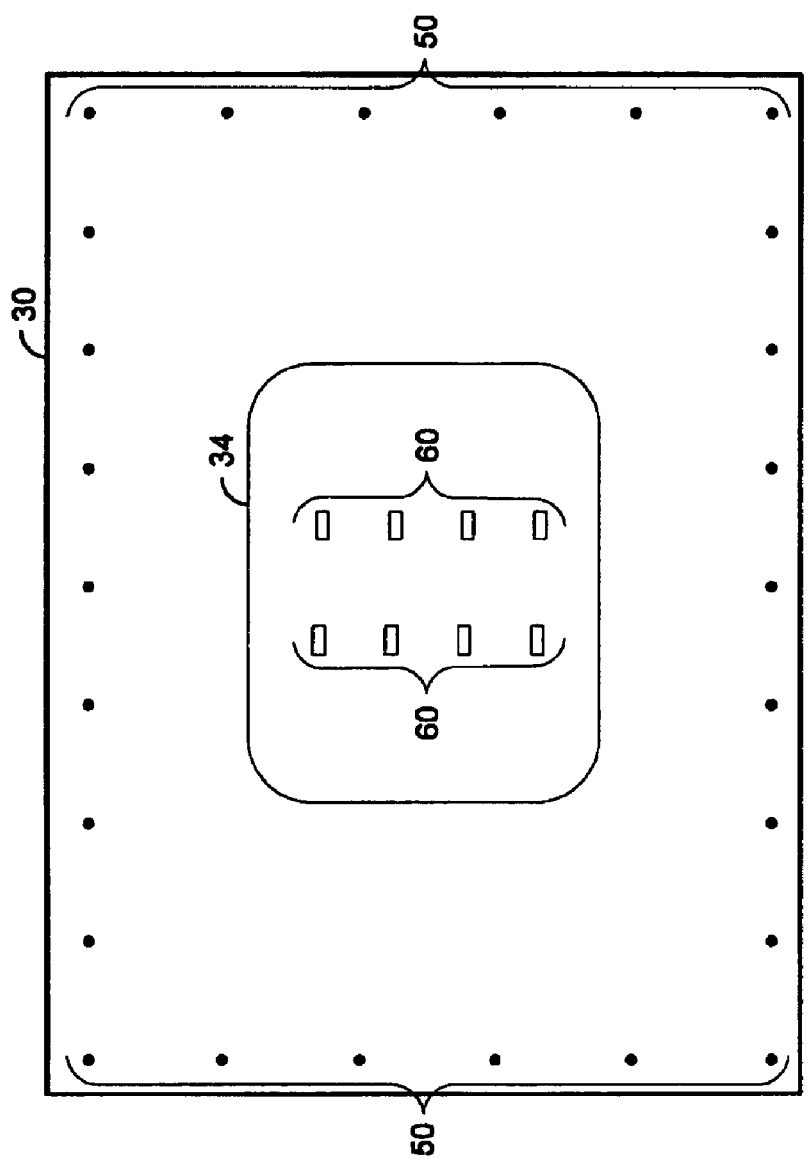
FIG. 8 is a bottom view of an integrated circuit package according to some embodiments.

FIG. 8 is a bottom view of IC package 30 according to some embodiments. Pins 50 are shown disposed around a perimeter of IC package 30, although any configuration of pins 50 may be used in conjunction with some embodiments. IC package 30 may define recess 34 in which land-side capacitors 60 reside. Land-side capacitors 60 may be mounted in recess 60 to assist the functionality of IC die 10 and/or to reduce resonance between IC package 30 and a board on which IC package 30 is mounted.

According to some embodiments, package 30 is a surface-mountable substrate such as an Organic Land Grid Array substrate that may be mounted directly onto a motherboard or mounted on a pinned interposer which mates with a socket of a motherboard. Packaging systems other than those mentioned herein may be used in conjunction with some embodiments.

Figure 9B:
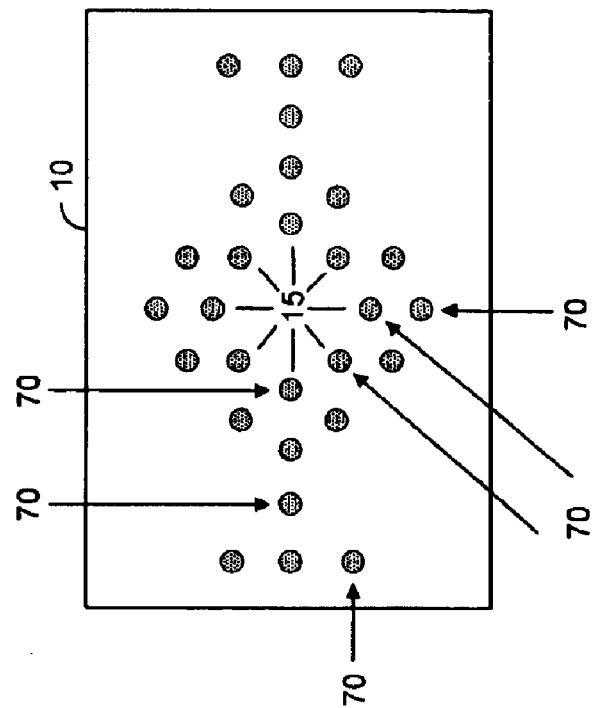
FIGS. 9a and 9b are views of an integrated circuit die according to some embodiments.
Figure 9A:
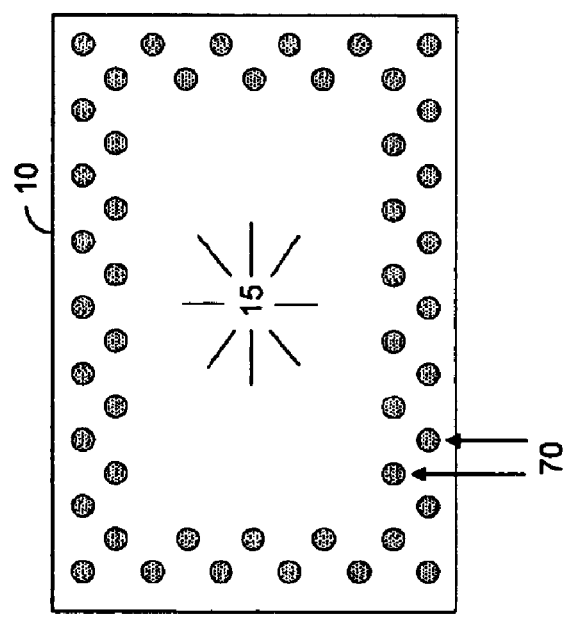

FIGS. 9*a* and 9*b* show two instances of IC die 10 according to some embodiments. In each case, circular conductive contacts 15 are disposed on IC die 10 in a manner that may facilitate the direction of energy to each interconnect that is coupled to each conductive die contact 15. Arrows 70 illustrate beam paths that could be used to direct laser or other types of energy to interconnect elements 20 that are in contact with conductive contacts 15.

Figure 10:
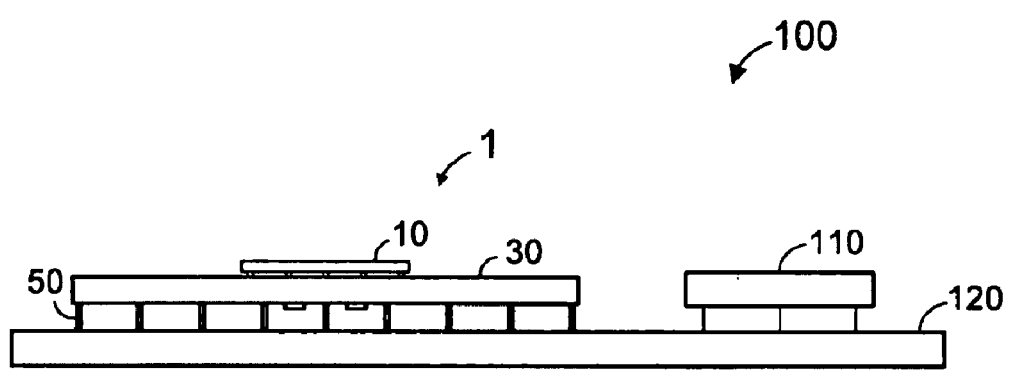
FIG. 10 is a side elevation of a system according to some embodiments.

FIG. 10 illustrates a system according to some embodiments. System 100 includes system 1 of FIG. 1, memory 110 and motherboard 120. System 100 may comprise components of a desktop computing platform. Memory 110 may comprise any type of memory for storing data, such as a Single Data Rate Random Access Memory, a Double Data Rate Random Access Memory, or a Programmable Read Only Memory.

Memory 110 and motherboard 120 may be electrically coupled to IC die 10 of system 1. More particularly, motherboard 110 may comprise a memory bus (not shown) coupled to pins 50 and to memory 110. In operation, motherboard 120 may route input/output and power signals to pins 50 for transmission to IC die 10.

The several embodiments described herein are solely for the purpose of illustration. In some embodiments, IC package 30 is coupled to an interposer using some of the above-described embodiments for coupling IC die 10 to package 30. Some embodiments may include any currently or hereafter-known versions of the elements described herein. Therefore, persons skilled in the art will recognize from this description that other embodiments may be practiced with various modifications and alterations.

What is claimed is:

1. A method comprising:
   directing first energy to only a first interconnect element, the first interconnect element contacting a first conductive contact of a first device and a second conductive contact of a second device, the first interconnect element to form a first electrical connection between the first conductive contact and the second conductive contact based at least in part on the first energy; and
   after directing the first energy to only the first interconnect element, directing second energy to only a second interconnect element, the second interconnect element contacting a third conductive contact of the first device and a fourth conductive contact of the second device, the second interconnect element to form a second electrical connection between the third conductive contact and the fourth conductive contact based at least in part on the second energy.

2. A method according to claim 1, wherein directing the first energy comprises directing a laser at the first interconnect element, and wherein directing the second energy comprises directing the laser at the second interconnect element.

3. A method according to claim 1, wherein the first interconnect element comprises a Controlled Collapse Chip Connect interconnect element.

4. A method according to claim 1, wherein the first interconnect element comprises a solder ball.

5. A method according to claim 1, wherein at least one of the first conductive contact, the second conductive contact, the third conductive contact, and the fourth conductive contact comprise solder paste.

6. A method according to claim 1, wherein the first conductive contact and the third conductive contact are disposed on an integrated circuit die, and wherein the second conductive contact and the fourth conductive contact are disposed on an integrated circuit package.

7. A method according to claim 1, wherein the first conductive contact and the third conductive contact are disposed on an integrated circuit package, and wherein the second conductive contact and the fourth conductive contact are disposed on a package interposer.

8. A method according to claim 1, further comprising:

joining the first device and the second device to create a combined device, wherein a plurality of interconnect elements are disposed between the first device and the second device, and wherein each of the plurality of interconnect elements is visible from one or more locations external to the combined device.

9. A method to create a system including an integrated circuit die having a first plurality of conductive contacts, an integrated circuit package having a second plurality of conductive contacts, and a plurality of interconnect elements in contact with respective ones of the first plurality of conductive contacts and respective ones of the second plurality of conductive contacts, the method comprising:

directing first energy to only a first one of the plurality of interconnect elements, the first interconnect element contacting a first one of the first plurality of conductive contacts and a first one of the second plurality of conductive contacts, the first interconnect element to form a first electrical connection between the first one of the first plurality of conductive contacts and the first one of the second plurality of conductive contacts based at least in part on the first energy;

after directing the first energy to only the first interconnect element, directing second energy to only a second one of the plurality of interconnect elements, the second interconnect element contacting a second one of the first plurality of conductive contacts and a second one of the second plurality of conductive contacts, the second interconnect element to form a second electrical connection between the second one of the first plurality of conductive contacts and the second one of the second plurality of conductive contacts based at least in part on the second energy; and coupling a double data rate memory to the integrated circuit package.

10. A method according to claim 9, wherein directing the first energy comprises directing a laser at the first interconnect element, and wherein directing the second energy comprises directing the laser at the second interconnect element.

11. A method according to claim 9, wherein the first interconnect element comprises a Controlled Collapse Chip Connect interconnect element.

12. A method according to claim 9, wherein the first interconnect element comprises a solder ball.

13. A method according to claim 9, wherein at least one of the first conductive contact, the second conductive contact, the third conductive contact, and the fourth conductive contact comprise solder paste.

14. A method according to claim 9, wherein each of the plurality of interconnect elements is visible from one or more locations external to the combined device.

* * * * *